[12] United States Patent
Chan et al.

(10) Patent No.: US 10,211,354 B2
(45) Date of Patent: Feb. 19, 2019

(54) MONOLITHICALLY INTEGRATED SOLAR CELL SYSTEM

(71) Applicant: NEWSOUTH INNOVATIONS PTY LIMITED, Sydney (AU)

(72) Inventors: Catherine Emily Chan, Waterloo (AU); Stuart Ross Wenham, Cronulla (AU); Brett Jason Hallam, Bexley (AU); Alison Maree Wenham, Cronulla (AU)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 0 days.

(21) Appl. No.: 14/771,949

(22) PCT Filed: Feb. 28, 2014

(86) PCT No.: PCT/AU2014/000189
§ 371 (c)(1),
(2) Date: Sep. 1, 2015

(87) PCT Pub. No.: WO2014/131088
PCT Pub. Date: Sep. 4, 2014

(65) Prior Publication Data
US 2016/0013341 A1   Jan. 14, 2016

(30) Foreign Application Priority Data

Mar. 1, 2013   (AU) ................ 2013900704

(51) Int. Cl.
*H01L 31/0465*    (2014.01)
*H01L 27/142*    (2014.01)
(Continued)

(52) U.S. Cl.
CPC ........ *H01L 31/0465* (2014.12); *H01L 27/142* (2013.01); *H01L 31/028* (2013.01); *H01L 31/046* (2014.12); *H01L 31/0475* (2014.12); *H01L 31/068* (2013.01); *H01L 31/1804* (2013.01); *H01L 31/186* (2013.01); *Y02E 10/547* (2013.01)

(58) Field of Classification Search
CPC ............. H01L 31/0465; H01L 31/0475; H01L 31/068; H01L 31/028; H01L 31/1804; H01L 31/186; H01L 31/047; H01L 31/0687; H01L 27/142
See application file for complete search history.

(56) References Cited

U.S. PATENT DOCUMENTS 4,631,352 A * 12/1986 Daud ................. H01L 31/0687
                                                       136/249
4,933,021 A   6/1990 Swanson
(Continued)

*Primary Examiner* — Eli S Mekhlin
(74) *Attorney, Agent, or Firm* — Ballard Spahr LLP

(57) ABSTRACT

A monolithically integrated system of silicon solar cells. A system having a silicon substrate and a plurality of solar cells formed on the silicon substrate. Each solar cell can have an emitter portion and a base portion. The system can also have a plurality of intermediate regions, each intermediate region having a polarity and electrically separating at least two portions of adjacent solar cells from one another such that the polarity of the intermediate region is opposite to a polarity of at least one of the separated portions of the adjacent solar cells.

9 Claims, 15 Drawing Sheets

(51) Int. Cl.
*H01L 31/068* (2012.01)
*H01L 31/0475* (2014.01)
*H01L 31/046* (2014.01)
*H01L 31/028* (2006.01)
*H01L 31/18* (2006.01)

(56) References Cited

U.S. PATENT DOCUMENTS

| | | | | |
|---|---|---|---|---|
| 5,595,607 | A | * | 1/1997 | Wenham ........... H01L 31/02242 136/244 |
| 5,730,808 | A | * | 3/1998 | Yang ................. H01L 31/03685 136/249 |
| 2006/0144435 | A1 | * | 7/2006 | Wanlass ............ H01L 31/06875 136/249 |
| 2011/0089420 | A1 | * | 4/2011 | Prabhakar ........... H01L 31/1804 257/53 |

* cited by examiner

MONOLITHICALLY INTEGRATED SOLAR CELL SYSTEM

CROSS REFERENCE TO RELATED APPLICATIONS

This application is a national phase filing of International patent application No. PCT/AU2014/000189, filed Feb. 28, 2014, which claims priority to Australian patent application No. 2013900704, filed on Mar. 1, 2013, both of which are herein incorporated by reference in their entireties.

FIELD OF THE INVENTION

The present invention relates to a monolithically integrated system of solar cells on a silicon substrate.

Throughout this specification the term "silicon substrate" is used broadly for any type of silicon material including a silicon wafer or any silicon layer that is formed on a suitable substrate that may or may not comprise silicon.

BACKGROUND OF THE INVENTION

Conventional wafer-based solar cells are relatively large and have a horizontal junction formed along a surface of the wafer. Electrical current generated by the solar cell must be transported to terminals of the solar cell in order to be extracted. Since the conductivity of silicon itself is insufficient to transport this electrical current along large distances, metal fingers are used to conduct the current to the terminal regions. However, there are several disadvantages related to the presence of such metallic fingers, which relate to their cost, shading losses, enhanced recombination at metal/semiconductor interfaces, diffusion of metal particles into active areas of the solar cells, resistive losses within the metal fingers, metal adhesion problems and encapsulation requirements.

The performance of solar cell systems can be improved by scaling down the dimensions of each solar cell of such a system thereby increasing the number of solar cells per unit area.

For example, the so-called "Sliver cell" technology may be used to form a plurality of such small solar cells that are interconnected in series. However, large-scale production at low cost remains a challenge.

The present invention provides further improvement.

SUMMARY OF THE INVENTION

In accordance with a first aspect, the present invention provides a monolithically integrated system of silicon solar cells, the system comprising:
  a silicon substrate;
  a plurality of solar cells formed on the silicon substrate; and
  a plurality of intermediate regions, each intermediate region having a portion that has a polarity and is arranged to electrically separate at least one of:
  a base portion of at least one of the solar cells from a base portion of an adjacent solar cell, and
  an emitter portion of at least one of the solar cells from an emitter portion of an adjacent solar cell.

In a first embodiment each intermediate region comprises a first portion of a first polarity arranged to electrically separate one of:
  a base portion of at least one of the solar cells from a base portion of an adjacent solar cell, and
  an emitter portion of at least one of the solar cells from an emitter portion of an adjacent solar cell;
  each intermediate region further comprising a second portion of a second polarity that is opposite the first polarity and is arranged to electrically separate the other one of:
  a base portion of at least one of the solar cells from a base portion of an adjacent solar cell, and
  an emitter portion of at least one of the solar cells from an emitter portion of an adjacent solar cell.

The first and/or second portions may at least partially be formed from silicon that is doped with electron acceptors or donors and may extend partially or entirely from a surface, such as a top surface, to another surface, such as a rear surface of a silicon substrate. Forming of the first and/or second portion may comprise use of a laser to incorporate dopants.

The intermediate regions may be arranged to electrically interconnect the emitter portions to the base portions of adjacent solar cells in series.

In the first embodiment the first and the second portions of at least one of the intermediate regions may be arranged to form a tunnel junction. The tunnel junction may be arranged to electrically interconnect the emitter portion to the base portion of adjacent solar cells to each other. Metal ions or impurities such as nickel may be incorporated into the tunnel junction to locally enhance the conductivity of the tunnel junction.

In some embodiments, the monolithically integrated system of solar cells further comprises a layer of an electrically conductive material on a surface portion of at least one of the intermediate regions. The layer of the conductive material may comprise a metallic material such as evaporated or sputtered aluminium or plated contact materials. The electrically conductive material may also be a conductive oxide material and may comprise one or more of indium tin oxide, zinc oxide, aluminium zinc oxide and tin oxide.

In one embodiment the layer is patterned such that at least a portion of the conductive material is positioned to interconnect the intermediate regions.

In another embodiment the layer comprises layer portions that are formed from amorphous silicon and layer portions that are formed form crystallised silicon. The crystallisation may have been induced by treating the amorphous silicon at selected positions using a laser.

In embodiments of the present invention, the monolithically integrated system of solar cells further comprises doped semiconductor fingers that are in contact with a portion of an active region of the solar cells and that are arranged to reduce resistive losses of the system. The doped semiconductor fingers may form paths that have the highest conductivity of the system. The semiconductor fingers may extend into the intermediate regions. Each semiconductor finger may contact directly only one or none of the intermediate regions.

The monolithically integrated system of solar cells may further comprise an interconnection region that comprises an inactive region that may be located at an edge portion of the silicon substrate. The interconnection region may be arranged to interconnect a component of the system to another component, such as another system and may also be arranged for coupling to external wires or metal tracks.

The silicon substrate may be provided in any one of a number of forms and may for example comprise monocrystalline, polycrystalline thin film or wafer material. Each exposed surface portion of the silicon substrate may be passivated. Passivation may be achieved via a dielectric layer which may comprise silicon nitride, silicon oxide, aluminium oxide, amorphous silicon. The dielectric layer may also function as a hydrogen source to enable hydrogenation.

In a second embodiment each intermediate region has a portion that has a polarity. In this embodiment each portion is arranged to electrically separate one of: base portions of adjacent solar cells and emitter portions of adjacent solar cells. In this embodiment the other one of the base portions and the emitter portions are electrically separated by a recess. The recess may have been formed by laser ablation or chemical etching.

In accordance with a second aspect, the present invention provides a method of forming a monolithically integrated system of solar cells, the method comprising the steps of:
  providing a silicon substrate with at least one solar cell; and
  forming a plurality of spaced apart intermediate regions such that the intermediate regions separate portions of the at least one solar cell from each other, each intermediate region having a portion that has a polarity and is arranged to electrically separate from each other at least one of:
  a base portion of at least one of the solar cells from a base portion of an adjacent solar cell, and
  an emitter portion of at least one of the solar cells from an emitter portion of an adjacent solar cell.

In a first embodiment the step of forming the plurality of spaced apart intermediate regions comprises:
  providing a layer containing electron donors on a silicon substrate;
  diffusing electron donors into first regions of the silicon substrate using a laser to form first portions of the intermediate regions;
  providing a layer containing electron acceptors on the silicon substrate; and
  diffusing electron acceptors into second regions of the silicon substrate using a laser to form second portions of the intermediate regions.

The method may for example comprise forming an aluminium oxide layer and redistributing aluminium atoms from the aluminium oxide layer into the first portions or the second portions.

The method may also comprise forming an electrical interconnection across at least some of the intermediate regions to interconnect at least some adjacent solar cells.

Further, the method may comprise forming a layer of a conductive material on at least some of the intermediate regions to interconnect at least some adjacent solar cells. The conductive material may comprise metallic particles or a conductive oxide. Forming a layer of conductive material may comprise patterning a suitable material such that conductive portions only remain over a portion each of at least some intermediate regions to establish electrical interconnection of at least some adjacent solar cells.

Forming the conductive layer may further comprise forming a dielectric surface layer. The dielectric layer may comprise amorphous silicon and the method may comprise selectively crystallising regions of the silicon to selectively increase an electrical conductivity. The crystallisation may be induced using a laser.

Interconnection regions at terminals may be formed in a variety of ways. In one example, the interconnection regions may be formed by incorporating dopants using a laser.

In a second embodiment the step of forming the plurality of spaced apart intermediate regions comprises:

providing a layer containing electron donors or electron acceptors on a silicon substrate;
  diffusing at least a portion of the electron donors or acceptors into first regions of the silicon substrate using a laser to form the first portions; and
  removing semiconductor material from second regions of the silicon substrate to form recesses in the silicon substrate, the recesses forming the second portions.

The step of removing semiconductor material from second regions oh the silicon substrate to form the recesses may comprise ablating material using a laser or etching technique.

In accordance with a third aspect, the present invention provides a monolithically integrated system of silicon solar cells, the system comprising:
  a silicon substrate;
  a plurality of solar cells formed on the silicon substrate, each solar cell comprising an emitter portion of a first polarity and a base portion of a second polarity; and
  a plurality of intermediate regions, each intermediate region having a first portion of the first polarity being arranged to electrically separate the base portions of adjacent solar cells from each other and a second portion of the second polarity being arranged to electrically separate the emitter portions of the adjacent solar cells from each other;
  wherein the first portion and the other portion of each intermediate region are arranged to electrically interconnect the base portion of one of the solar cells to the emitter portion of an adjacent one of the solar cells.

BRIEF DESCRIPTION OF THE DRAWINGS

In order to fully understand the present invention, embodiments of the present invention will now be described, by way of example only, with reference to the accompanying drawings, in which.

DETAILED DESCRIPTION OF EMBODIMENTS

Embodiment of the present invention relate to a monolithically integrated system of solar cells that are formed on a silicon substrate. The monolithically integrated system comprises a plurality of intermediate regions separating the solar cells from one another.

Figure 1:
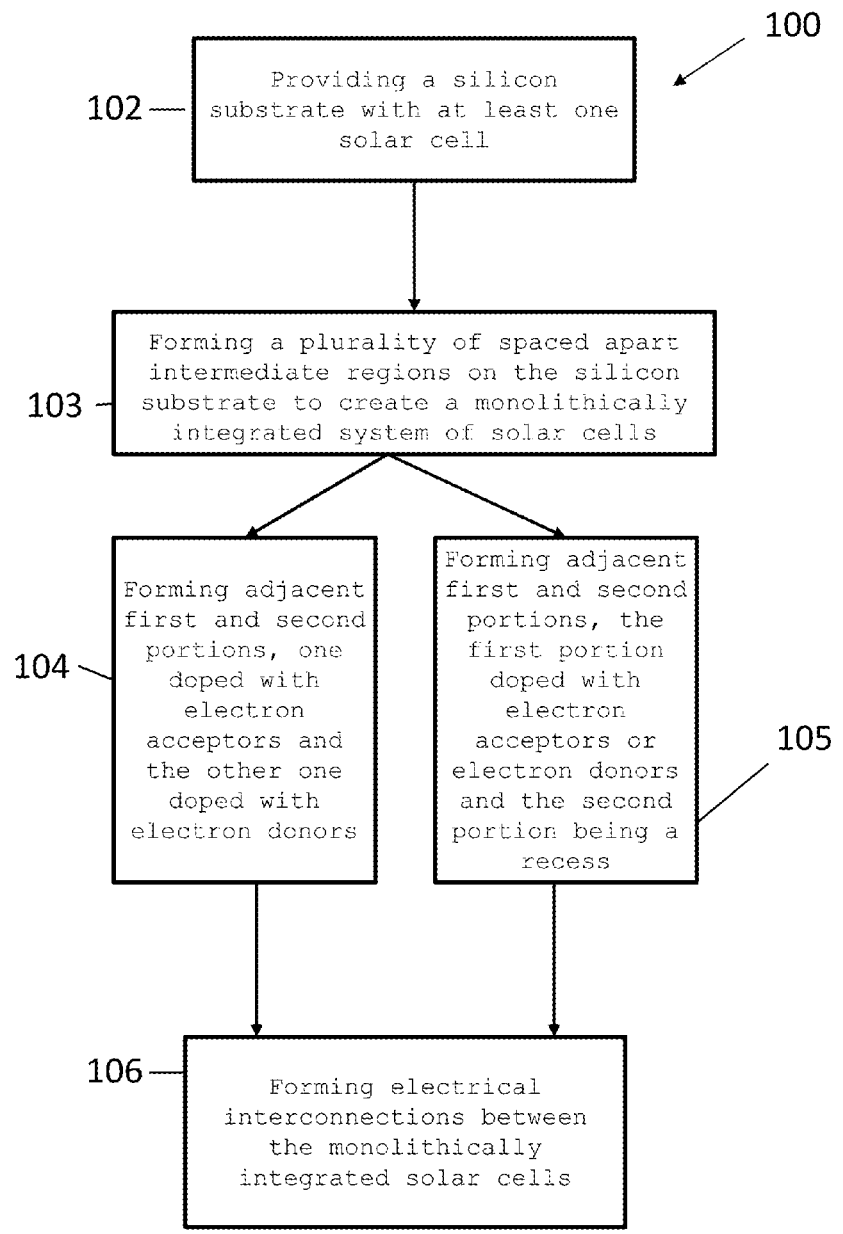
FIG. 1 is a flow-chart that illustrates a method of forming a monolithically integrated system of electronic devices on a silicon wafer in accordance with an embodiment of the invention.
Figure 2:
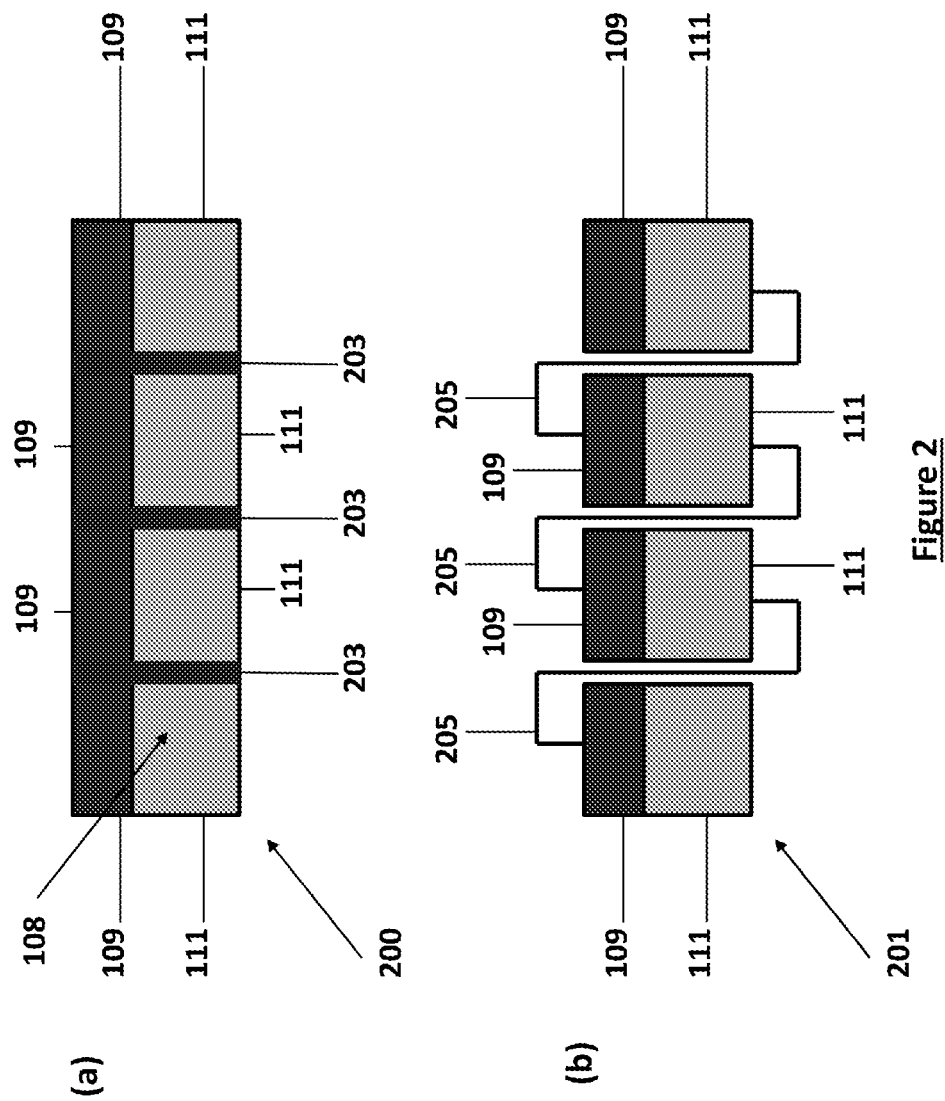
FIGS. 2 to 7 are schematic representations illustrating manufacturing steps of monolithically integrated systems in accordance with embodiments of the present invention.

Referring initially to FIG. 1, there is shown a flow-chart of a method 100 of forming a monolithically integrated device in accordance with embodiments of the present invention. Step 102 provides a silicon substrate comprising at least one solar cell. Step 103 forms a series of intermediate regions on the silicon substrate to separate portions of the solar cell from each other. The intermediate regions may be created by forming two doped portions in the silicon substrate; a first portion is doped with electron donors (n-type) and a second portion is doped with electron acceptors (p-type, step 104). Alternatively, the intermediate regions may be created by forming a first doped portion in the semiconductor material that is doped with either electron donors or electron acceptors and a second portion that is in the form of a recess (step 105). Step 106 forms electrical interconnections between the monolithically integrated solar cells on the silicon substrate.

Referring now to FIGS. 2 to 15, the monolithically integrated system of solar cells in accordance with an embodiment of the present invention is now described in further detail.

FIG. 2(a) is a series of solar cells 200 formed on a silicon substrate 108 with intermediate regions 203. The intermediate regions 203 electrically separate the emitter area 109 of a given solar cell from the emitter area 109 of each adjacent solar cell and electrically separate the base area 111 of a given solar cell from the base area 111 of each adjacent solar cell, creating a system of multiple integrated discrete solar cells with a smaller area. FIG. 2(a) shows the solar cells that are physically interconnected. Each discrete solar cell has its own emitter area 109 and base area 111.

In embodiments of the present invention, the intermediate regions 203 are arranged to extract charge carriers from each integrated solar cell, eliminating the need for metal contacts. An example of a system of electrically interconnected solar cells 201 is shown in FIG. 2(b). In these embodiments the maximum size of each discrete solar cell is limited by a trade-off between resistive losses, due to majority carriers travelling through each integrated solar cell towards the closest isolation region, and the ratio of active solar cells surface area to intermediate regions surface area.

In FIG. 2(b) an electrical interconnection 205 is created between the integrated cells, separated by intermediate regions 203. The electrical interconnection 205 in FIG. 2(b) is only a schematization of a connection created between the integrated cells. In one example the electrical interconnection 205 may be implemented by tuning the electrical and physical properties of the intermediate regions 203.

The electrical current generated by a solar cell is typically proportional to the surface area of the solar cell exposed to electromagnetic radiation. The current generated by each integrated solar cell is a portion of the current which would be generated by a solar cell extending on the entire area of the silicon substrate 108. Resistive losses are linked to the value of current by a quadratic relation. The increased resistivity due to the lack of metal fingers can be compensated by the lower value of current generated by each individual integrated solar cell.

In an embodiment of the present invention, the intermediate regions 203 are formed by creating regions in the silicon substrate 108 which are doped with electron acceptors or electron donors. In embodiments of the invention, these regions are created by depositing a layer containing electron donors or electron acceptors on a surface of the silicon substrate 108 using a suitable deposition technique, such as spin coating. Subsequently the electron acceptors or electron donors are "driven" into the bulk region of the silicon substrate 108 by diffusion using a laser beam. The laser beam melts the silicon substrate 108 locally, allowing the electron donors or acceptors to diffuse into the bulk region of the silicon substrate 108.

Laser doping can be used to create doped regions in a silicon substrate with a precise doping profile. Heavily doped regions can be created using laser doping up to a depth of 20 micrometers into the silicon substrate. In embodiments of the present invention, laser doping is used to create the intermediate regions 203 and electrical interconnections between different areas of the monolithically integrated solar cell system. Methods for creating isolation regions in a silicon substrate will now be described in further detail.

Figure 3:
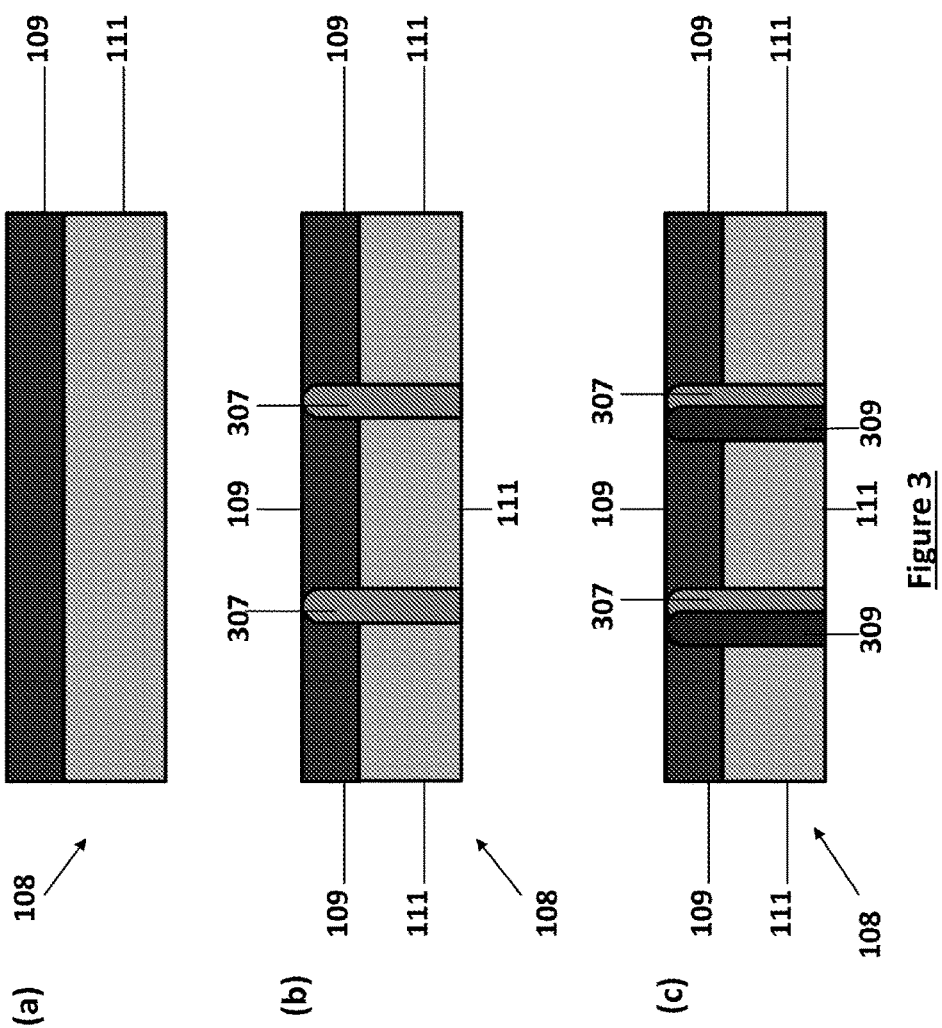

FIG. 3 illustrates a series of processing steps to create the isolation regions 203 using laser doping. To electrically separate the integrated solar cells on the silicon substrate 108, two portions, one doped with electron acceptors and one doped with electron donors, are created in between two integrated solar cells. FIG. 3(a) shows a schematic view of a portion of a solar cell realized on the silicon substrate 108. The solar cell comprises a base area 111 and an emitter area 109. FIG. 3(b) shows a cross-sectional view of the silicon substrate 108 with two portions 307 that are doped with electron acceptors. The portions are created using laser doping. Laser doping has been performed from the back surface of the silicon substrate, through the base area 111 of the solar cell. The portions 307 of the silicon substrate 108 doped with electron acceptors electrically separate the emitter area 109 of a given solar cell from the emitter area 109 of the adjacent solar cells. FIG. 3(c) schematically illustrates a cross-sectional view of the silicon substrate 108 with two portions 309 that are doped with electron donors. The portions 309 that are doped with electron donors overlap the portions 307 that are doped with electron acceptors. The doped portions electrically separate regions of the solar cell base area 111 from the base area 111 of adjacent solar cells. The combined effect of the doped portions is to create an intermediate region which electrically separates the solar cell in multiple smaller solar cells.

In the embodiment represented in FIG. 3(c) the silicon substrate may have a thickness up to 20 micrometers. In this case the doped portions can extend throughout the entire thickness of the substrate with a good control of the doping density, allowing the electrical isolation of the solar cells by single sided processing. In this embodiment the laser doped portions can be formed from only one surface of the silicon substrate 108. For example, the laser doping process may be performed on the back surface of the silicon substrate 108. The laser doped portions extend through the base area 111, the emitter area 109 and reach the front surface of the silicon substrate 108.

Doping from one side of the silicon substrate is less complicated to implement than doping from both sides. An advantage of doping from the rear side only is that the effect to the front surface of the silicon substrate is relatively small due to the semi-elliptical shape of the laser doped portions. Hence, the loss of conversion efficiency due to loss of active area at the light collecting surface of the silicon substrate is minimized.

Figure 4:
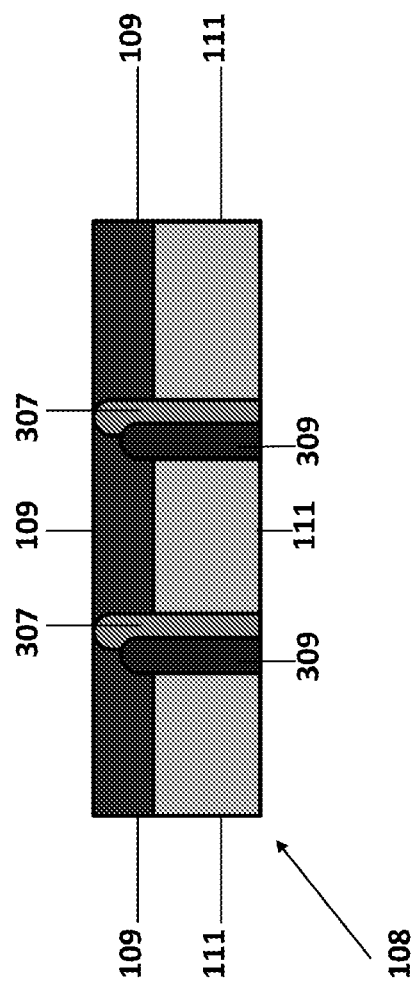
Figure 5:
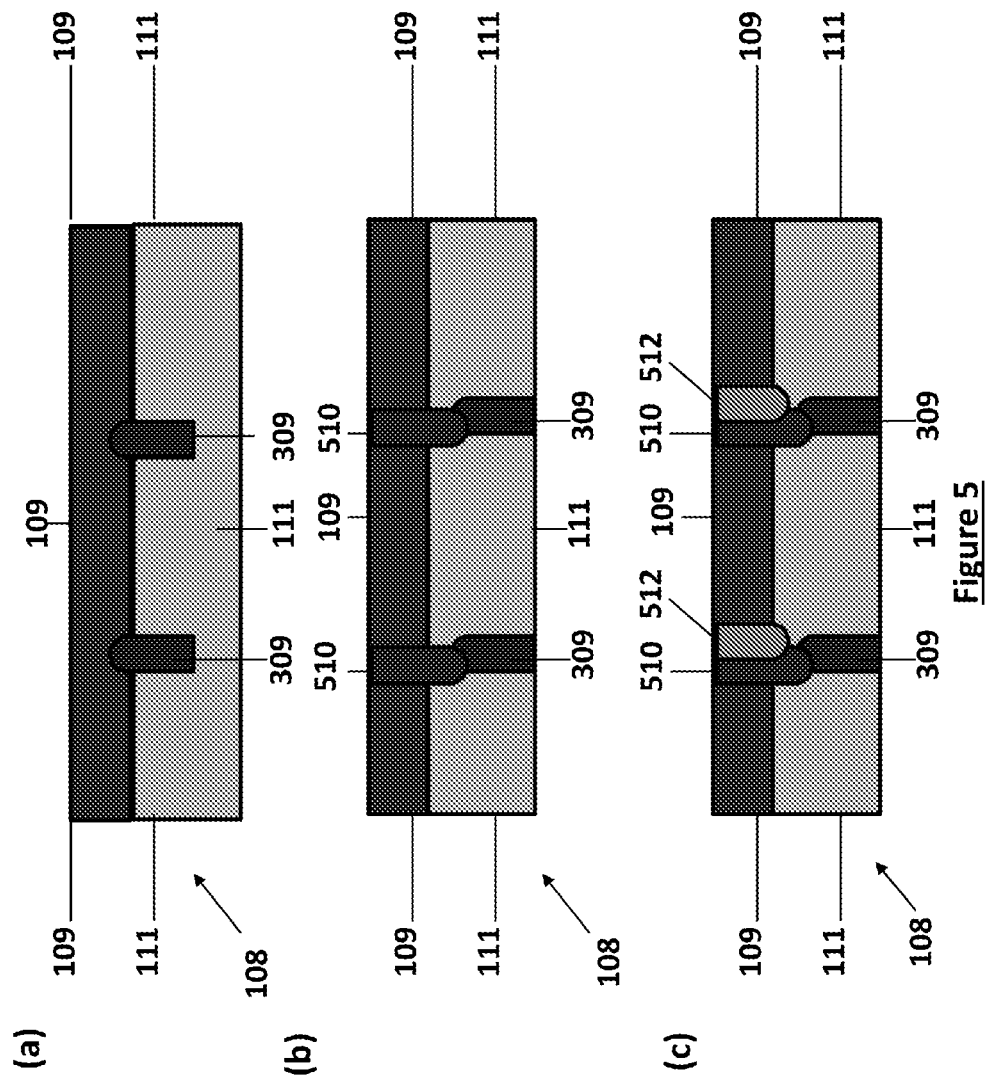
Figure 6:
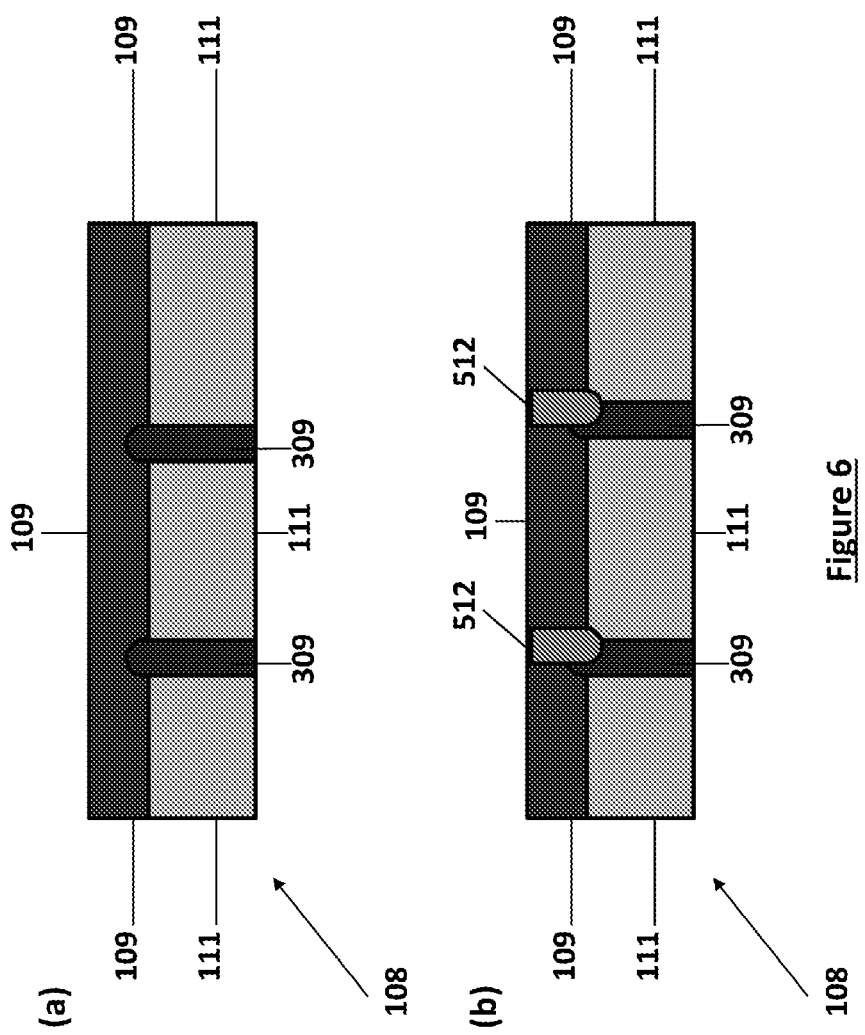

To further minimize the inactive area at the front surface of the silicon substrate, a portion 309 that is doped with electron donors may be designed to reach the emitter area 109 of the solar cell without reaching the front surface of the silicon substrate. This arrangement is shown in FIG. 4.

In some embodiments of the present invention the use of a silicon substrate 108 with a thickness larger than 20 micrometers is envisaged. For example, a silicon substrate 108 with a thickness of 30 microns may be used to realize the solar cell system. The base area 111 of the solar cell may have a thickness larger than 20 micrometers and a single laser doping step performed from the back surface of the silicon substrate 108 would not be sufficient to isolate the base area 111.

Referring now to FIG. 5(a), there is shown a cross-sectional view of the silicon substrate 108 with portions 309 doped with electron donors created using a laser doping step from the back surface of the silicon substrate 108. In order to isolate the base area 111 of the solar cell completely, the portions 309 of the silicon substrate 108 doped with electron donors should reach the emitter area of the solar cell 109.

FIG. 5(b) shows the silicon substrate 108 with portions 510 doped with electron donors created using a laser doping step from the front surface of the silicon substrate 108 and aligned with the doped portions 309, in accordance with an embodiment of the present invention. To isolate the emitter area 109 of the solar cell, regions of the silicon substrate 108 doped with electron acceptors 512 are created using a laser doping step from the front surface of the silicon substrate 108, as schematically shown in FIG. 5(c). An advantage of this embodiment is the possibility of forming intermediate regions to create a monolithically integrated system of solar cells on silicon substrates with a thickness larger than 20 micrometers. These wafers are less delicate and easier to handle in a production environment.

In some embodiments of the present invention the use of a silicon substrate 108 with a thickness larger than 20 micrometers is envisaged. However, the respective maximum size of the base area 111 and the emitter area 109 of the solar cell may be smaller than 20 microns. In these embodiments, in order to minimize the number of processing steps and the area of the light collecting surface of the wafer affected by laser doping damage, the intermediate regions 203 can be realized with a single laser doping step on each surface of the silicon substrate 108.

Referring now to FIG. 6(a), there is shown the silicon substrate 108 with portions 309 being doped with electron donors created using a laser doping step from the back surface of the silicon substrate 108. These portions reach the emitter area of the solar cell 109. FIG. 6(b) shows a cross-sectional view of the silicon substrate 108 with portions doped with electron acceptors 512 created using a laser doping step from the front surface of the silicon substrate 108 to isolate the emitter area 109 of the solar cell. In this embodiment the doped portions 512 realized from the front surface partially overlap with the doping portions 309 realized from the back surface.

Figure 7:
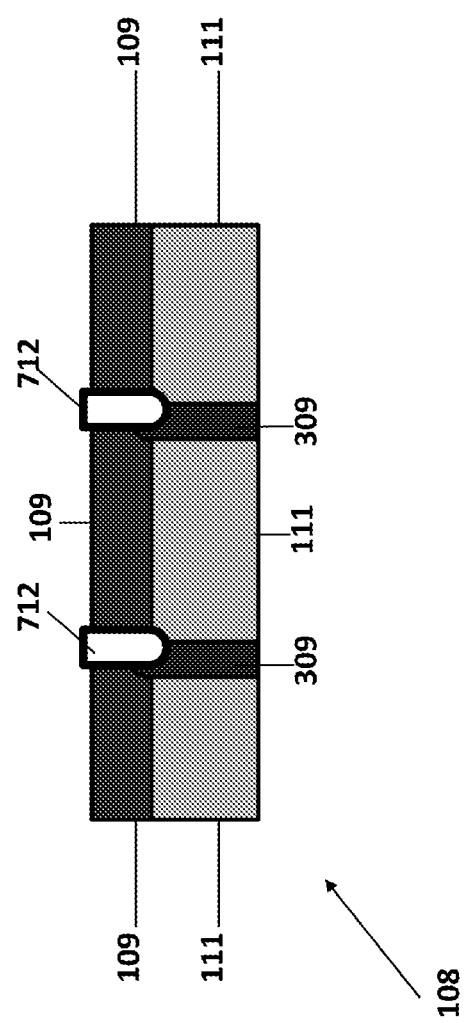

Referring now to FIG. 7, there is shown the silicon substrate 108 in accordance with an embodiment of the present invention where one laser doping step is performed to isolate either the base area 111 or the emitter area 109 of the solar cell. For example, a laser doping step may be performed on the back surface of the silicon substrate 108 to realize portions 309 doped with electron donors and isolate the base area 111. In this embodiment, a different method may be used to isolate the emitter area 109. For example, a portion 712 of the semiconductor material may be removed from the silicon substrate 108. The removal of the semiconductor material may be performed using, for example, etching techniques or laser ablation techniques. In the embodiment shown in FIG. 7, a portion of semiconductor material is removed from the light receiving surface of the silicon substrate 108. The semiconductor material is removed throughout the emitter area 109 of the solar cell to the base area 111 of the solar cell.

In an alternative embodiment a laser doping step may be performed on the light receiving surface of the silicon substrate 108 to realize a portion 307 doped with electron acceptors which extends throughout the entire thickness of the silicon substrate 108 and isolates the emitter area 109. A different method may be used to isolate the base area 111. For example, portion of semiconductor material may be removed from the back surface of the silicon substrate 108 to isolate the base area 111. Methods for interconnecting monolithically integrated solar cells on a silicon substrate 108 will now be described in further detail.

Figure 8:
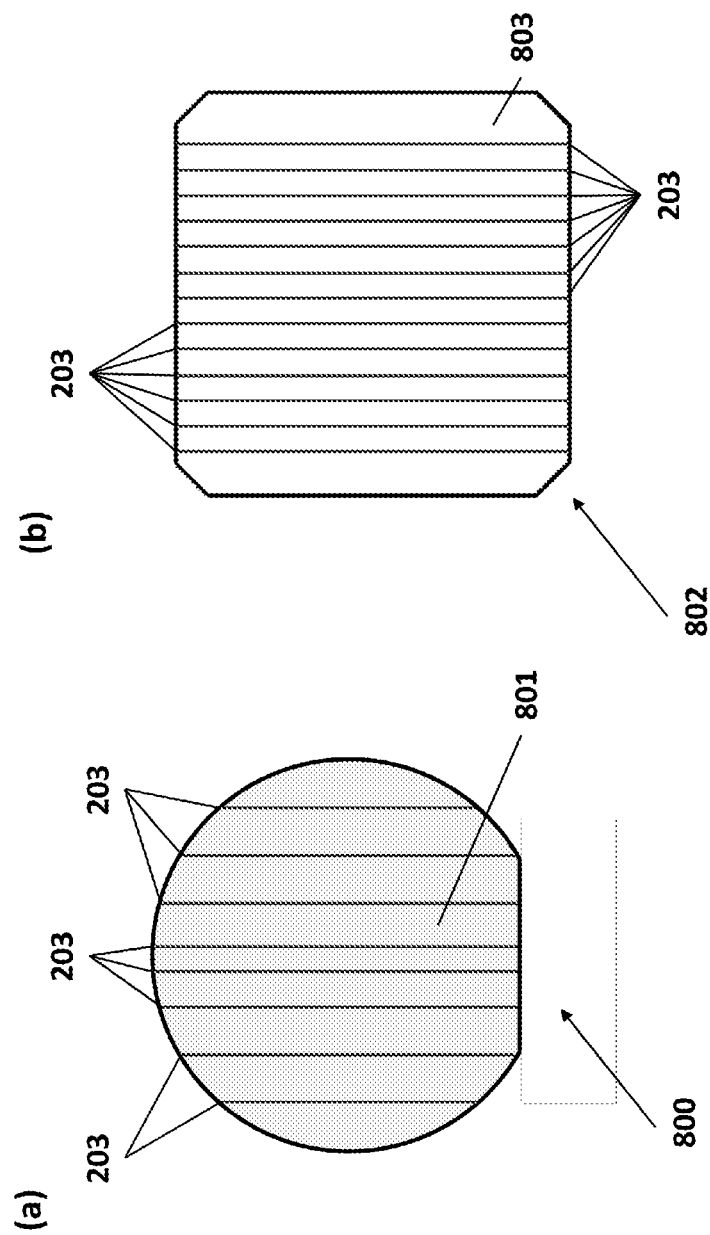
FIG. 8 is a schematic representation of two different wafers comprising intermediate regions in accordance with embodiments of the invention.
Figure 9:
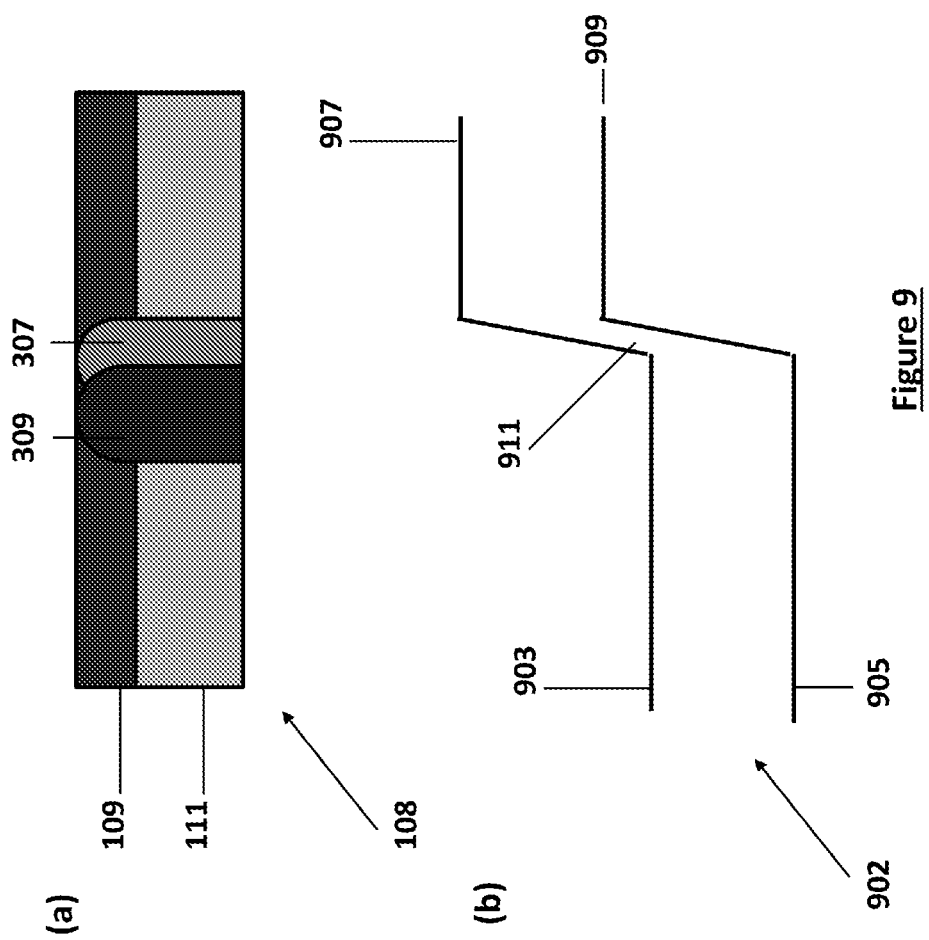
FIG. 9 is a schematic representation of a tunnel junction realized in accordance with an embodiment of the invention.
Figure 10:
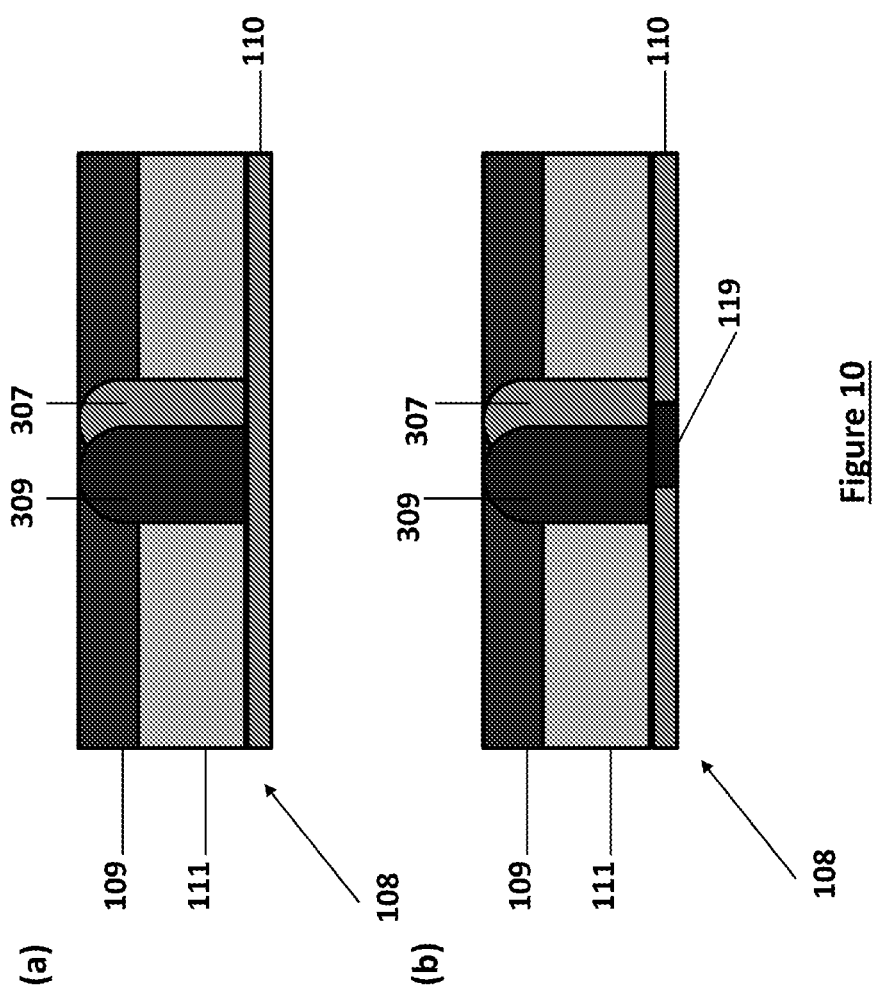
FIGS. 10 to 15 are schematic representations illustrating manufacturing steps of monolithically integrated systems in accordance with embodiments of the present invention.
Figure 11:
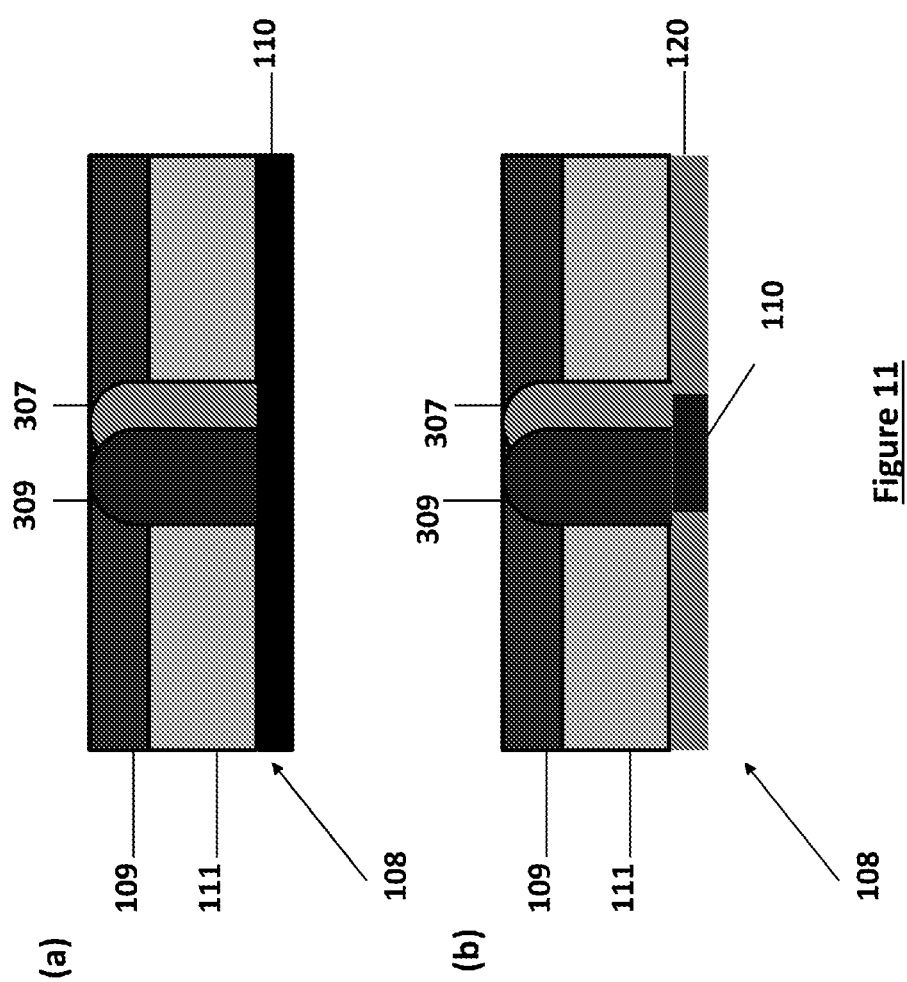

Using the techniques and methods described above, a system of monolithically integrated solar cells on a silicon substrate can be created. FIG. 8 shows two examples of silicon substrates 801, 803 where monolithically integrated solar cells systems have been formed. In these specific examples, a large area solar cell is first realized on the silicon substrate 801, 803 and successively intermediate regions 203 are created, in accordance with embodiments of the present invention, to isolate areas of the large solar cell and create smaller monolithically integrated solar cell devices.

Each individual integrated solar cell has an open circuit voltage similar to the open circuit voltage of the initial large area solar cell. Each individual integrated solar cell has a short circuit current which is a portion of the short circuit current of the initial large area solar cell. Typically the ratio between the short circuit current of an integrated solar cell and the short circuit current of the initial large area solar cell is related to the ratio between the surface area of the integrated solar cell and the surface area of the initial large area solar cell.

FIG. 8 aims to provide only an indication of how the intermediate regions may be configured to create a monolithically integrated system of solar cells on the silicon substrate 801, 803. The number of intermediate regions and their configuration may be different in different embodiments of the invention.

To efficiently extract the energy converted by each individual integrated solar cell from the silicon substrate 108, a connection scheme between the integrated solar cells must be implemented. For example, in some embodiments of the present invention, the intermediate regions 203 may be arranged to provide a series connection between adjacent integrated solar cells. A schematic representation of adjacent solar cells connected in series is shown in FIG. 2(b). To implement a series connection between adjacent integrated solar cells the intermediate regions 203 must be arranged to electrically interconnect the emitter area of each solar cell device with the base area of adjacent solar cell devices.

The intermediate regions 203 are arranged to provide a series connection between adjacent integrated solar cells. The distance between the intermediate regions 203 is not uniform along the longitudinal direction of the silicon substrate 801 to ensure that the integrated solar cells have a similar surface area and thus a similar short circuit current. This is an important requirement when the integrated cells are connected in series.

FIG. 8(b) shows a monolithically integrated system of solar cells 802 on a pseudo-square shaped silicon substrate 803. The intermediate regions 203 are arranged to provide a series connection between adjacent integrated solar cells. In this specific example a uniform distance between the intermediate regions 203 provides similar areas and similar currents for the integrated solar cells.

In embodiments of the present invention the intermediate regions 203 may be arranged to provide a series connection between adjacent integrated solar cells. In these embodiments the intermediate regions 203 are arranged to electrically interconnect the emitter portion of each solar cell with the base portion of the adjacent solar cell. The intermediate regions 203 may be configured to implement a tunnel diode.

A tunnel diode is a two terminal device which uses quantum mechanical effects to allow charge carriers to move from one terminal to the other across a tunnel junction. Typically a tunnel diode is realized using semiconductor material. In particular, creating a junction between a portion of semiconductor material doped with acceptors and another portion of semiconductor material doped with donors. In a tunnel diode the concentration of dopants of the materials which form the junction are higher than in a conventional diode. These high concentrations provide a very thin potential barrier which charge carriers can "tunnel through" and move from one side of the junction to the other.

Referring now to FIG. 9(a), there is shown the silicon substrate 108 with one intermediate region configured in accordance with an embodiment of the present invention. The doping density and the doping profile of the portion 307 doped with electron acceptors and the portion 309 doped with electron donors can be controlled by controlling the laser parameters during the laser doping process. The doping densities may be arranged to have values in the order of $10^{17}$ cm$^{-3}$ or above in at least one of the doped portions 307, 309 and the doping profiles may be arranged such that the two doped portions 307, 309 overlap forming a tunnel junction.

FIG. 9(b) shows a schematized electronic band diagram 902 of the tunnel junction in FIG. 9(a). FIG. 9(b) shows the conduction band edge 903 and the valence band edge 905 of the portion 309 doped with electron donors, the conduction band edge 907 and the valence band edge 909 of the region doped with electron acceptors 311 and the potential barrier 911. In this representation the tunnel junction is reversed biased. Charge carriers can tunnel through the potential barrier 911 connecting the emitter area 109 of an integrated solar cell device to the base area 111 of the adjacent integrated solar cell devices.

Arranging the intermediate regions 203 to form a tunnel junction allows the electrical interconnection of adjacent solar cells without the use of metals. Such an arrangement is advantageous for the overall efficiency of the solar cell device, decreasing impurity related defects and shading losses, and for the overall cost of the device, avoiding expensive metal materials, such as silver.

In embodiments of the invention additional materials may be introduced to realize or enhance the electrical interconnection of the integrated solar cells on the silicon substrate 108. In particular, additional layers of material may be deposited on at least one of the surfaces of the silicon substrate 108 after the intermediate regions 203 have been realized, or properties of existing dielectric layers may be altered to realize or enhance the interconnection.

FIG. 10(a) shows a cross-sectional view of the silicon substrate 108 with a layer 110 deposited on the back surface. In an embodiment, the layer 110 is a dielectric layer such as an amorphous semiconductor, for example, amorphous silicon. In this embodiment the electrical interconnection of adjacent integrated solar cells is realized by applying heat to the areas of the layer 110 aligned with intermediate regions 203. The applied heat induces local crystallization of the amorphous layer 110. FIG. 10(b) shows a cross-sectional view of the silicon substrate 108 with the crystallized area 119 which creates a conduction path for the charge carriers through the doped portions 307, 309 establishing or enhancing the electrical interconnection of the emitter area 109 of an integrated solar cell device to the base area 111 of the adjacent integrated solar cells. In some embodiments of the invention the amorphous layers may be doped with electron acceptors or electron donors. In other embodiments the amorphous layer may be intrinsic.

FIG. 11(a) schematically shows a cross-sectional view of the silicon substrate 108 in accordance with an embodiment of the invention where a layer of aluminium 110 is deposited onto the silicon surface. In this embodiment the electrical connection of the two intermediate portions 309 and 307 is established or enhanced by this conductive layer of aluminium 110. The aluminium across the active areas of the device can then be anodized to form anodic aluminium oxide 120 which is a non-conductive surface passivation layer, as schematically shown in FIG. 11(b).

Figure 12:
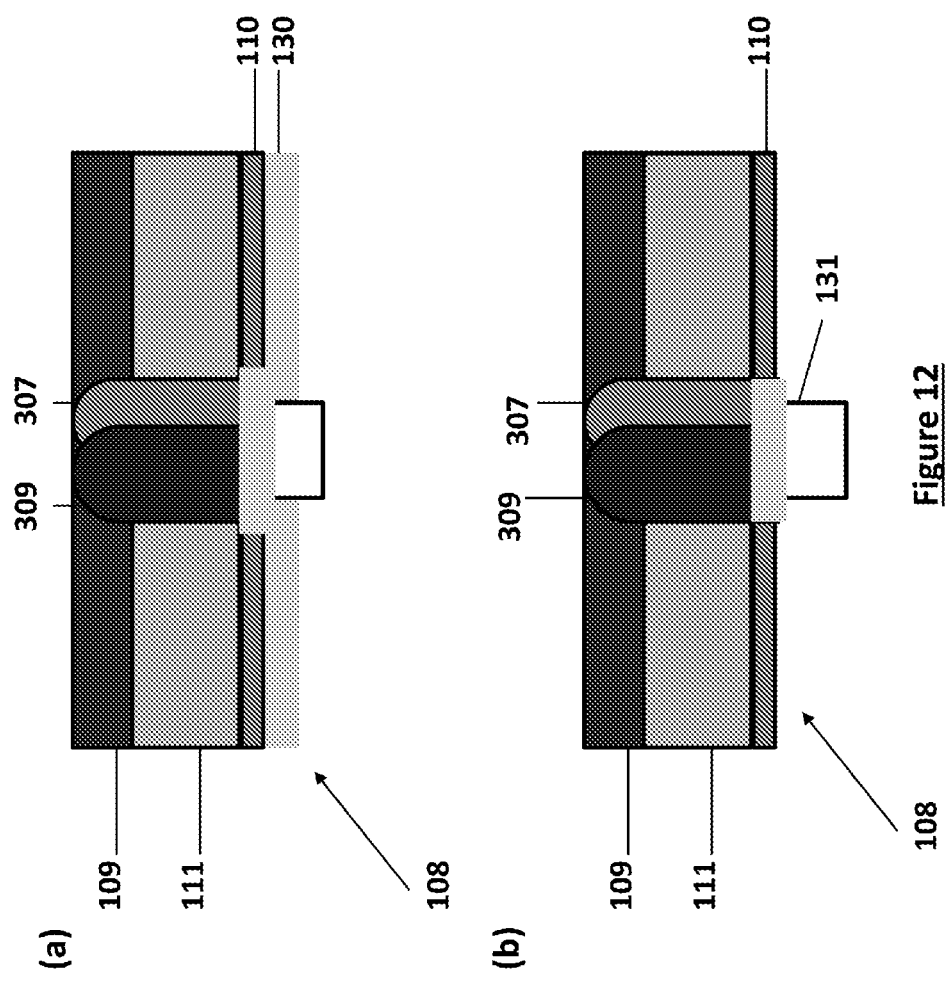

FIG. 12 schematically shows a cross-sectional view of the silicon substrate 108 in accordance with an embodiment of the invention where the intermediate regions 203 are realized after a dielectric layer 110 has already been deposited on a portion of the surface of the silicon substrate 108. An additional layer 130 of a conductive material may be deposited on at least a portion of the surface of the silicon substrate 108 to facilitate the electrical interconnection of the doped portions 307, 309. The dielectric layer 110 isolates the layer 130 from the surface of the silicon substrate 108. This provides a conduction path for the charge carriers through the doped portions 307, 309 avoiding additional heating steps. The conductive material layer 130 may be a conductive oxide, such as zinc oxide, aluminium zinc oxide, tin oxide or indium tin oxide. Such oxide layers, besides implementing the electrical interconnection of the integrated solar cells, improve the light trapping properties of each solar cell device. FIG. 12(b) shows the conductive oxide layer 131 after it has been patterned to remove the conductive oxide layer from the surfaces of the active solar cells.

Figure 13:
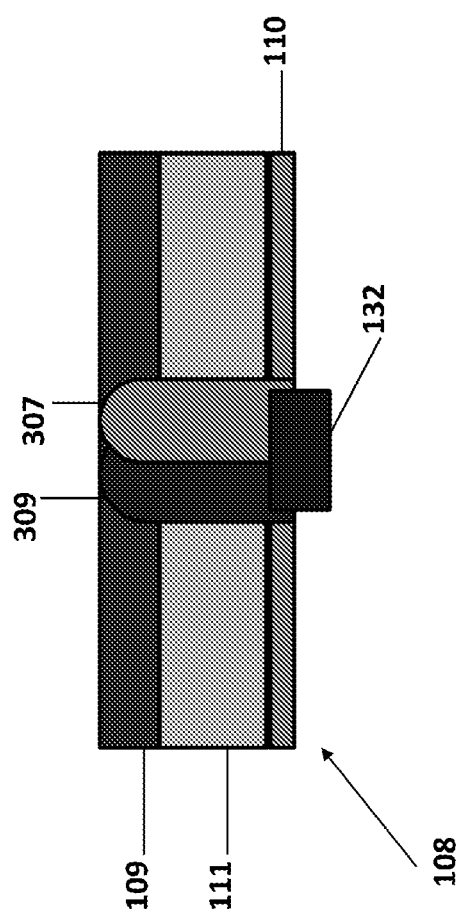

Referring now to FIG. 13, there is shown a cross-sectional view of the silicon substrate 108 in accordance with an embodiment of the present invention where a dielectric layer 110 is deposited on a surface before the doped portions 307, 309 are realized. In this embodiment, a conduction path between the doped portions 307, 309 may be created using a metal layer 132 deposited, for example, by electroless plating technique.

Figure 14:
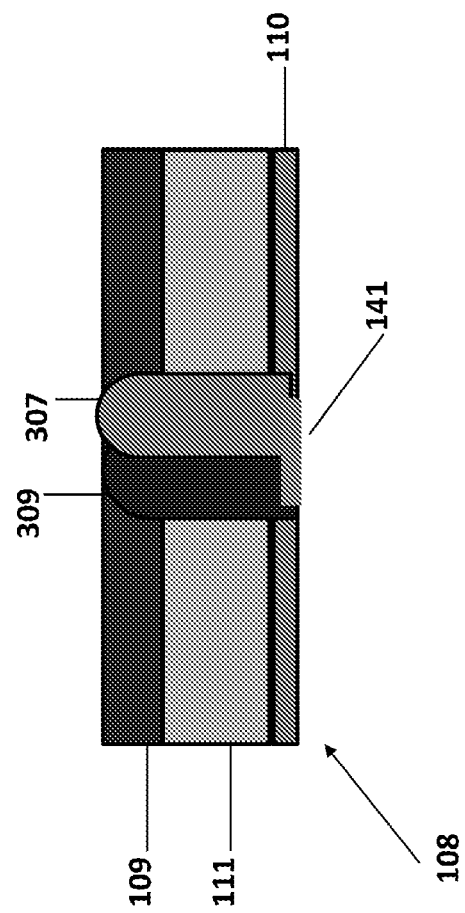
Figure 15:
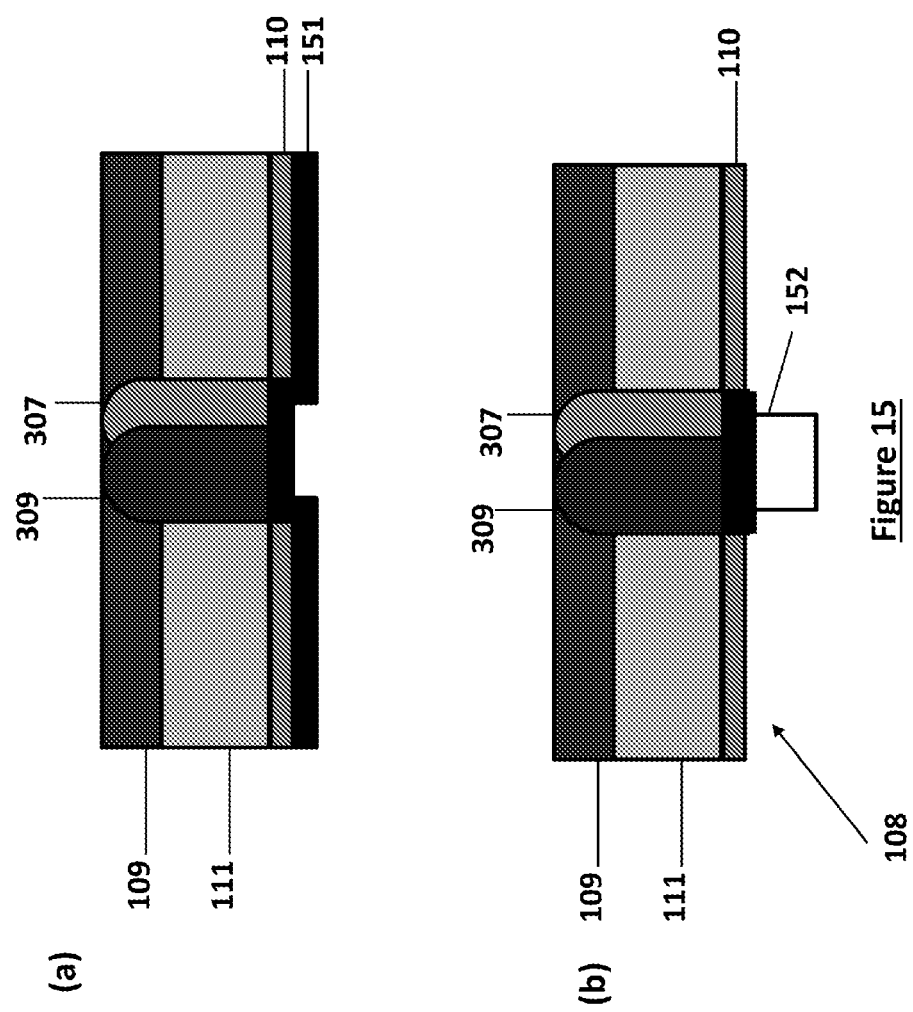

Referring now to FIG. 14, there is shown a cross-sectional view of the silicon substrate 108 in accordance with an embodiment of the present invention where a dielectric layer 110 is deposited on the back surface before the doped portions 307, 309 are realized. In this embodiment, a conduction path between the doped portions 307, 309 may be created introducing metal particles 141. The metal particles 141 may be diffused into the doped portions 307, 309 using liquid state or solid state diffusion techniques.

Referring now to FIG. 15(a), there is shown a cross-sectional view of the silicon substrate 108 in accordance with an embodiment of the present invention where a dielectric layer 110 is deposited on the back surface before the doped portions 307, 309 are realized. In this embodiment, a conduction path between the doped portions 307, 309 may be created introducing an aluminium layer 151 across the entire surface of the silicon substrate. FIG. 15(b) schematically shows the structure after patterning of the aluminium layer 151 such that the aluminium layer 151 is removed over part or the entire active solar cell region leaving behind the patterned aluminium area 152. Alternatively, layer 152 could be realised immediately by masking during the deposition process.

The embodiments of the invention described herein refer to the separation of a typical single junction wafer based solar cell and the creation of a monolithically integrated single junction solar cell system. However, embodiments of the present invention may be adapted to solar cell structures which comprise more than one junction or alternative structures to increase the collection of solar radiation and decrease the distance travelled by charge carriers before being collected. For example, each integrated solar cell device may comprise a double junction with one region doped with electron acceptors positioned between two regions doped with electron donor (npn) (or vice versa) or multiple junctions comprising multiple regions doped with electron acceptors and multiple regions doped with electron donors.

The invention claimed is:

1. A monolithically integrated system of silicon solar cells, the system comprising:
   a silicon substrate having a surface and comprising:
      a plurality of solar cells formed using the silicon substrate, each solar cell having a solar cell surface that forms a part of the substrate surface, each solar cell being adjacent another solar cell in a lateral direction and each solar cell comprising a base portion and an emitter portion, whereby the plurality of solar cells comprises a plurality of laterally adjacent base portions and a plurality of laterally adjacent emitter portions; and
      a plurality of silicon intermediate regions, each intermediate region consisting of:
      a first doped silicon portion arranged to electrically separate at least one of the base portions from at least one laterally adjacent base portion, the first portion having a polarity that is opposite to that of the base portions; and
      a second doped silicon portion arranged to electrically separate at least one of the emitter portions from at least one laterally adjacent emitter portion, the second portion having a polarity that is opposite to that of the emitter portions;
      the first doped silicon portion and the second doped silicon portion being in contact with each other and forming a p-n junction;
   wherein, in use, the emitter portions are electrically interconnected to the base portions of adjacent solar cells only through the p-n junction.

2. The system of claim 1 wherein each first portion or each second portion extends at least partially from a top surface to a rear surface of the silicon substrate.

3. The system of claim 1 wherein the first or second portions are formed using a laser to incorporate dopants into the silicon substrate.

4. The system of claim 1 wherein the first and the second portion of at least one of the intermediate regions are arranged to form a tunnel junction.

5. The system of claim 4 wherein the tunnel junction has metal ions or incorporated impurities to locally enhance the conductivity of the tunnel junction.

6. The system of claim 1 further comprising a layer that comprises an electrically conductive material on surface portions of at least some of the intermediate regions.

7. The system of claim 6 wherein the layer comprises layer portions that are formed from amorphous silicon and layer portions that are formed from crystallised silicon and the crystallised silicon portions are selectively positioned over portions of the intermediate regions.

8. The system of claim 7 wherein crystallisation of amorphous silicon is induced by treating the amorphous silicon with a laser at selected positions.

9. The system of claim 1 wherein the monolithically integrated system of solar cells further comprises doped semiconductor fingers that extend to the intermediate regions and are in contact with a portion of an active region of the solar cells to reduce resistive losses of the system.

* * * * *